United States Patent
Matsuda

(10) Patent No.: US 11,023,026 B2
(45) Date of Patent: Jun. 1, 2021

(54) MOBILE INFORMATION PROCESSING DEVICE, INTEGRATED CIRCUIT, AND BATTERY PACK

(71) Applicant: SEIKO EPSON CORPORATION, Tokyo (JP)

(72) Inventor: Kinya Matsuda, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 235 days.

(21) Appl. No.: 16/196,508

(22) Filed: Nov. 20, 2018

(65) Prior Publication Data

US 2019/0155353 A1    May 23, 2019

(30) Foreign Application Priority Data

Nov. 21, 2017 (JP) .............................. JP2017-223373

(51) Int. Cl.
| | |
|---|---|
| *G06F 1/28* | (2006.01) |
| *H02S 20/30* | (2014.01) |
| *H02J 7/00* | (2006.01) |
| *H02S 10/40* | (2014.01) |
| *H01L 35/32* | (2006.01) |
| *G06F 1/26* | (2006.01) |

(Continued)

(52) U.S. Cl.
CPC ................ *G06F 1/28* (2013.01); *G06F 1/263* (2013.01); *H01L 35/32* (2013.01); *H02J 7/0029* (2013.01); *H02J 7/0068* (2013.01); *H02S 10/40* (2014.12); *H02S 20/30* (2014.12); *H02S 40/38* (2014.12); *H02J 7/00302* (2020.01); *H02J 7/00304* (2020.01); *H02J 7/00306* (2020.01)

(58) Field of Classification Search
CPC .. G06F 1/28; G06F 1/263; H02S 40/38; H02J 7/0068; H02J 7/0013; H02J 7/00302
See application file for complete search history.

(56) References Cited

U.S. PATENT DOCUMENTS

| 10,746,000 B2 * | 8/2020 | Chu ...................... H02M 3/156 |
| 2002/0089308 A1 | 7/2002 | Sakurai |

(Continued)

FOREIGN PATENT DOCUMENTS

| JP | 2002-204532 A | 7/2002 |
| JP | 2009-069056 A | 4/2009 |

(Continued)

*Primary Examiner* — Jaweed A Abbaszadeh
*Assistant Examiner* — Gayathri Sampath
(74) *Attorney, Agent, or Firm* — Oliff PLC

(57) ABSTRACT

An integrated circuit includes: a first current detection circuit configured to, when a first enable signal is in an activated state, detect a current flowing between a first node and a second node, and generate an output signal, and when the first enable signal is in a deactivated state, stop a current detection operation; a first voltage detection circuit, which operates intermittently or operates continuously, that is configured to detect a voltage at the first node, and generate an output signal; and a control circuit that is configured to generate the first enable signal and supply the first enable signal to the first current detection circuit, and is configured to fetch the output signal of the first voltage detection circuit in a period other than the period in which the first enable signal transitions from a deactivated state to an activated state.

10 Claims, 8 Drawing Sheets

(51) Int. Cl.
*H02S 40/38* (2014.01)
*G06F 1/16* (2006.01)
*G06F 1/18* (2006.01)
*H01L 31/12* (2006.01)
*H01L 31/153* (2006.01)
*H01L 31/042* (2014.01)

(56) References Cited

U.S. PATENT DOCUMENTS

| | | | |
|---|---|---|---|
| 2006/0181244 A1* | 8/2006 | Luo | H02J 7/0068 |
| | | | 320/128 |
| 2009/0179650 A1 | 7/2009 | Omagari | |
| 2010/0194343 A1 | 8/2010 | Sano et al. | |
| 2011/0119005 A1* | 5/2011 | Majima | H01M 10/486 |
| | | | 702/63 |
| 2011/0133571 A1* | 6/2011 | Kiyohara | H01M 10/48 |
| | | | 307/130 |
| 2012/0206107 A1* | 8/2012 | Ono | H02J 7/0029 |
| | | | 320/136 |

FOREIGN PATENT DOCUMENTS

| | | |
|---|---|---|
| JP | 2010-183708 A | 8/2010 |
| JP | 2011-176939 A | 9/2011 |
| JP | 2014-178166 A | 9/2014 |
| JP | 2014-183682 A | 9/2014 |

\* cited by examiner

MOBILE INFORMATION PROCESSING DEVICE, INTEGRATED CIRCUIT, AND BATTERY PACK

This application claims priority to Japanese Patent Application No. 2017-223373, filed Nov. 21, 2017. The disclosure of the prior application is hereby incorporated in its entirety herein.

BACKGROUND

1. Technical Field

The present invention relates to a mobile information processing device including a chargeable secondary battery. Furthermore, the invention relates to an integrated circuit, a battery pack, and the like that are used in such a mobile information processing device.

2. Related Art

In recent years, mobile information processing devices that use electric power generated by a power generator such as a solar cell have become widely used. In such a mobile information processing device, electric power generated by a power generator is stored in a secondary battery, and as a result, electronic circuits can be operated by electric power supplied from the secondary battery.

Also, in order to prevent the secondary battery from being overcharged or over-discharged, a battery protection circuit that monitors the state of the secondary battery, and opens and closes a charging path and a discharging path is provided in the mobile information processing device. For example, a portion of the battery protection circuit is incorporated in an integrated circuit (IC), and the protection circuit constitutes a battery pack along with the secondary battery.

Incidentally, there are cases where mobile information processing devices are provided with various types of sensors such as an acceleration sensor and a pulse sensor, and power consumption thereof is increased because electric power needed to drive the various types of sensors. In such a case, because the electric power to be generated by a power generator such as a solar cell is limited, the power consumption of the battery protection circuit needs to be reduced as well.

As a related technology, a protection circuit is disclosed in JP-A-2011-176939 that, when an overcharge detection circuit and an over-discharge detection circuit, which respectively detect an overcharged state and an over-discharged state by comparing the voltage of a secondary battery with a reference voltage with high accuracy, are operated not continuously, but intermittently at predetermined intervals in order to reduce the power consumption, can reduce power consumption while maintaining the accuracy of detection of a limit voltage during a normal operation.

The protection circuit in JP-A-2011-176939 includes a control circuit that performs control such that, when the terminal voltage of the secondary battery is in a normal operation range, the monitoring operation interval of the overcharge detection circuit is reduced if the result of detecting the charging state indicates that the battery is being charged compared with the case where the result of detecting the charging state indicates that the battery is not being charged. The likelihood of the state transitioning from the normal state to the overcharged state is high when the battery is being charged compared with the case where the battery is not being charged. Therefore, as a result of performing control such that the monitoring operation interval of the overcharge detection circuit is reduced, a monitoring operation that corresponds to the charging state can be performed. Also, the over-discharge detection circuit may be stopped during the charging period.

Alternatively, the control circuit performs control such that, when the terminal voltage of the secondary battery is in a normal operation range, the monitoring operation interval of the over-discharge detection circuit is reduced if the result of detecting the discharging state indicates that the battery is being discharged compared with the case where the result of detecting the discharging state indicates that the battery is not being discharged. The likelihood of the state transitioning from the normal state to the over-discharged state is high when the battery is being discharged compared with the case where the battery is not being discharged. Therefore, as a result of performing control such that the monitoring operation interval of the over-discharge detection circuit is reduced, the monitoring operation according to the discharging state can be performed. Also, the overcharge detection circuit may be stopped during the discharging period.

In order to protect the secondary battery with high accuracy, a current detection circuit that performs a protection operation by detecting a current that flows into the secondary battery when being charged or detecting a current that is discharged from the secondary battery when being discharged needs to be provided in addition to a voltage detection circuit that performs a protection operation by detecting the voltage of the secondary battery. In this case, in order to increase the operating time of the secondary battery in the mobile information processing device, the power consumption of the current detection circuit needs to be reduced. In particular, in a wearable apparatus such as a sport watch whose weight needs to be reduced while mounting a large number of sensors, the reduction of power consumption is strongly demanded.

It is also conceivable that the current detection circuit and the voltage detection circuit are operated intermittently in order to reduce power consumption in the mobile information processing device. Because the secondary battery needs to be protected from an overcurrent as quickly as possible, the current detection circuit needs to be operated at a period shorter than that of the voltage detection circuit. However, when the current detection circuit or the voltage detection circuit is operated intermittently, the consumption current fluctuates when the circuit is started or stopped, and as a result, the voltage or the current of the secondary battery that is to be detected also fluctuates, and the detection accuracy is affected.

SUMMARY

An advantage of some aspects of the invention is to reduce power consumption of a mobile information processing device or an integrated circuit in which a current detection circuit that detects a current of a secondary battery is provided in addition to a voltage detection circuit that detects a voltage of the secondary battery. Also, another advantage of some aspects of the invention is to improve the detection accuracy of the voltage or the current, even if the consumption current fluctuates when the circuit is started or stopped, when the current detection circuit or the voltage detection circuit is operated intermittently in such a mobile information processing device or integrated circuit. Furthermore, another advantage of some aspects of the invention is to provide a battery pack or the like that includes such an integrated circuit along with a secondary battery.

A mobile information processing device according to a first aspect of the invention includes: a secondary battery for storing electric power; a power feeding circuit configured to supply electric power to the secondary battery; a load circuit that includes an electronic circuit that is supplied with electric power from the secondary battery and a sensor that is controlled by the electronic circuit; a first current detection circuit configured to, when a first enable signal is in an activated state, detect a current flowing between a first node connected to one end of the secondary battery and a second node connected to the power feeding circuit or the load circuit, and generate an output signal, and when the first enable signal is in a deactivated state, stop a current detection operation; a first voltage detection circuit, which operates intermittently or operates continuously, that is configured to detect a voltage at the first node, and generate an output signal; and a control circuit that is configured to generate the first enable signal and supply the first enable signal to the first current detection circuit, and is configured to fetch the output signal of the first voltage detection circuit in a period other than the period in which the first enable signal transitions from a deactivated state to an activated state.

A mobile information processing device according to a second aspect of the invention includes: a secondary battery for storing electric power; a power feeding circuit configured to supply electric power to the secondary battery; a load circuit that includes an electronic circuit that is supplied with electric power from the secondary battery and a sensor that is controlled by the electronic circuit; a first current detection circuit configured to, when a first enable signal is in an activated state, detect a current flowing between a first node connected to one end of the secondary battery and a second node connected to the power feeding circuit or the load circuit, and generate an output signal, and when the first enable signal is in a deactivated state, stop a current detection operation a first voltage detection circuit, which operates intermittently or operates continuously, that is configured to detect a voltage at the first node, and generate an output signal; and a control circuit that is configured to generate the first enable signal and supply the first enable signal to the first current detection circuit, and is configured to fetch the output signal of the first voltage detection circuit after a first period has elapsed from when the first enable signal transitioned from a deactivated state to an activated state.

An integrated circuit according to a third aspect of the invention include: a first current detection circuit configured to, when a first enable signal is in an activated state, detect a current flowing between a first node and a second node, and generate an output signal, and when the first enable signal is in a deactivated state, stop a current detection operation; a first voltage detection circuit, which operates intermittently or operates continuously, that is configured to detect a voltage at the first node, and generate an output signal; and a control circuit that is configured to generate the first enable signal and supply the first enable signal to the first current detection circuit, and is configured to fetch the output signal of the first voltage detection circuit in a period other than the period in which the first enable signal transitions from a deactivated state to an activated state.

According to the first, second, or third aspect of the invention, in a mobile information processing device or an integrated circuit that is provided with a first current detection circuit that detects a current of the secondary battery in addition to the first voltage detection circuit that detects a voltage of the secondary battery, the first current detection circuit operates intermittently, and as a result, power consumption can be reduced.

Also, the control circuit fetches an output signal of the first voltage detection circuit in a period other than the period in which the first enable signal to be supplied to the first current detection circuit transitions from a deactivated state to an activated state, and as a result, even if the consumption current fluctuates when the first current detection circuit is started, and the voltage at the first node fluctuates, the output signal of the first voltage detection circuit is fetched in a period other than the period in which the voltage fluctuates. Therefore, the detection accuracy can be improved.

In this case, the control circuit may fetch the output signal of the first voltage detection circuit in a period other than the period in which the first enable signal transitions from an activated state to a deactivated state. Accordingly, even if the consumption current fluctuates when the first current detection circuit is stopped, and the voltage at the first node fluctuates, since the output signal of the first voltage detection circuit is fetched in a period other than the period in which the voltage fluctuates, the detection accuracy can be improved.

Also, when the control circuit fetches the output signal of the first voltage detection circuit after a first period has elapsed from when the first enable signal transitioned from a deactivated state to an activated state, and fetches the output signal of the first voltage detection circuit after a second period has elapsed from when the first enable signal transitioned from an activated state to a deactivated state, the first period is desirably longer than the second period. Because the time it takes for the voltage at the first node to stabilize is longer when the first current detection circuit is started than when the circuit is stopped, as a result of lengthening the period from when the first enable signal transitioned until when the output signal of the first voltage detection circuit is fetched, the output signal of the first voltage detection circuit can be fetched after the voltage at the first node has stabilized.

Furthermore, the first voltage detection circuit may, when a second enable signal is in an activated state, detect a voltage at the first node and generate an output signal, and when the second enable signal is in a deactivated state, stop a voltage detection operation, and the control circuit may generate the second enable signal and supply the second enable signal to the first voltage detection circuit, and fetch the output signal of the first current detection circuit in a period other than the period in which the second enable signal transitions from a deactivated state to an activated state. Accordingly, even if the consumption current fluctuates when the first voltage detection circuit is started, and the current flowing between the first node and the second node fluctuates, the output signal of the first current detection circuit can be fetched in a period other than the period in which the current fluctuates, and as a result, the detection accuracy can be improved.

In this case, the control circuit may fetch the output signal of the first current detection circuit in a period other than the period in which the second enable signal transitions from an activated state to a deactivated state. Accordingly, even if the consumption current fluctuates when the first voltage detection circuit is stopped, and the current flowing between the first node and the second node fluctuates, the output signal of the first current detection circuit can be fetched in a period other than the period in which the current fluctuates, and as a result, the detection accuracy can be improved.

Also, when an integrated circuit is provided with a second current detection circuit configured to, when a third enable signal is in an activated state, detect a current flowing between the first node and the second node and generate an output signal, and when the third enable signal is in a deactivated state, stop a current detection operation; and a second voltage detection circuit configured to, when a fourth enable signal is in an activated state, detect a voltage at the first node and generate an output signal, and when the fourth enable signal is in a deactivated state, stop a voltage detection operation, the control circuit may cause the first enable signal and the third enable signal to transition at the same time. Accordingly, the period of current detection in each of the first and second current detection circuits can be reduced.

A battery pack according to a fourth aspect of the invention includes any of the integrated circuits described above and a secondary battery that has one end connected to the first node. According to the fourth aspect of the invention, in a battery pack that includes an integrated circuit that includes at least the first voltage detection circuit and the first current detection circuit, as a result of improving the detection accuracy while reducing the power consumption of the integrated circuit, the consumption of the secondary battery can be suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
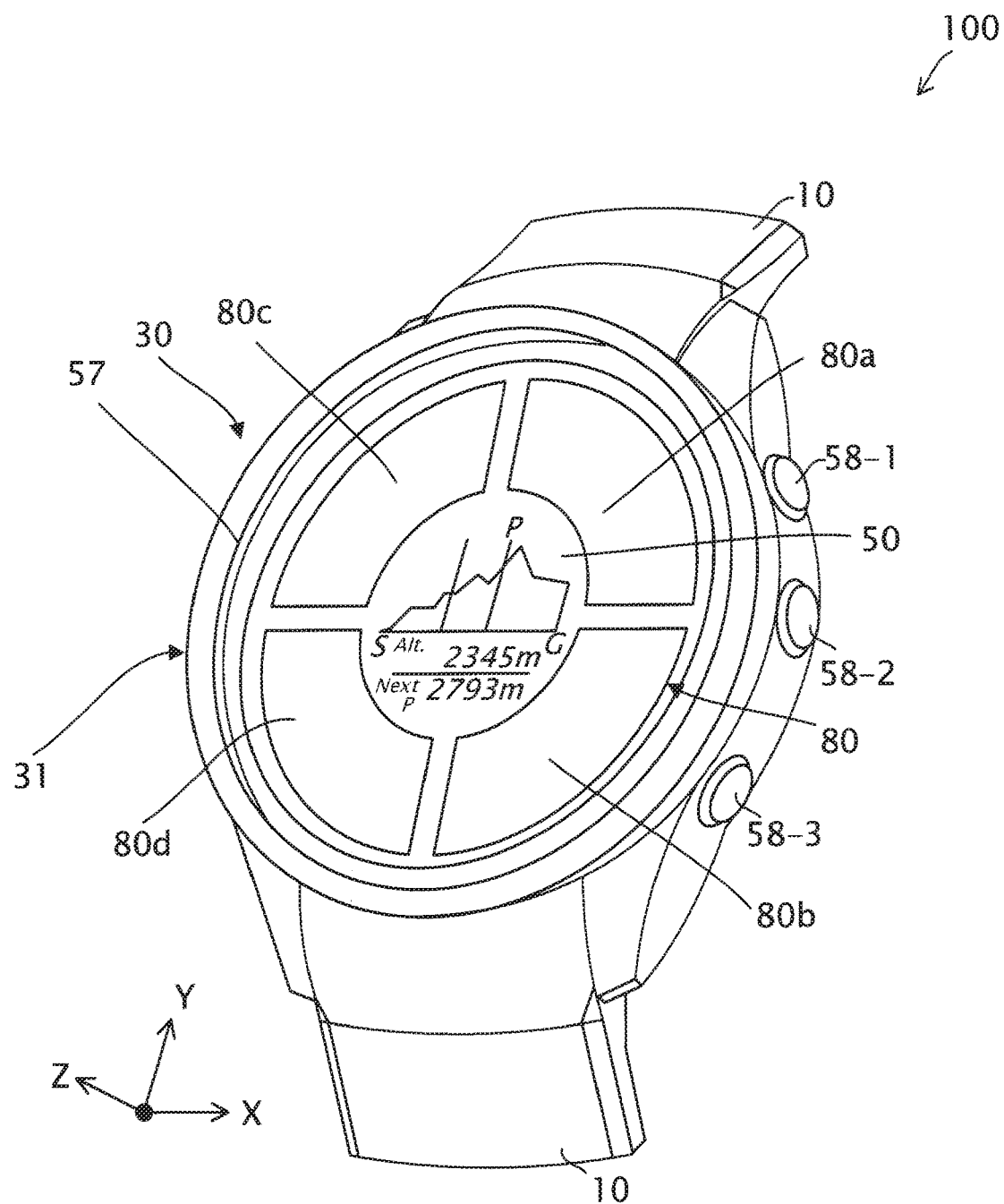
FIG. 1 is a perspective view illustrating an external view of a mobile information processing device on a front side according to embodiments of the invention.

Hereinafter, embodiments of the invention will be described in detail with reference to the drawings. The same constituent elements are given the same reference numerals, and a redundant description is omitted.

Configuration of Mobile Information Processing Device

FIG. 1 is a perspective view illustrating an external view of a mobile information processing device on a front side according to embodiments of the invention. The mobile information processing device is a wearable apparatus or the like that is to be attached to a user's body. In the following, a wrist apparatus such as a sport watch that has an external view similar to a wrist watch and is to be attached to a user's wrist will be described as an example. Note that shapes or the ratio of sizes of units in FIG. 1 and other drawings may be different from those of actual ones.

A mobile information processing device 100 includes a band 10 and a device body 30. The device body 30 includes a casing 31, a display 50, a bezel 57, buttons 58-1 to 58-3, and a solar cell 80. The solar cell 80 includes light receiving surfaces 80a to 80d on which light such as sunlight is incident.

As shown in FIG. 1, the direction from the center of the display surface of the display 50 toward the button 58-2 is defined as a positive direction of an X-axis, the direction from the center of the display surface of the display 50 toward the band 10 on the upper side in the diagram is defined as a positive direction of a Y-axis, and the direction separating from the device body 30 in the direction normal to the display surface of the display 50 is defined as a positive direction of a Z-axis.

The band 10 is attached to the device body 30, and is a member for attaching the device body 30 to a user. The casing 31 is a housing including an opening on a front side, and is made of metal such as stainless steel, or resin, for example. The display 50 is fitted into the opening of the casing 31, and displays an image. The bezel 57 is arranged so as to circularly surround the outer edge of the display 50, and is a member for protecting and reinforcing the display 50 and the casing 31.

When the buttons 58-1 to 58-3 are pressed down by the user, the mobile information processing device 100 is notified of various types of instructions. For example, when one of the buttons 58-1 to 58-3 is pressed down, the mobile information processing device 100 changes the image displayed in the display 50. The solar cell 80 functions as a power generator that generates electric power when supplied with energy of light such as sunlight.

Figure 2:
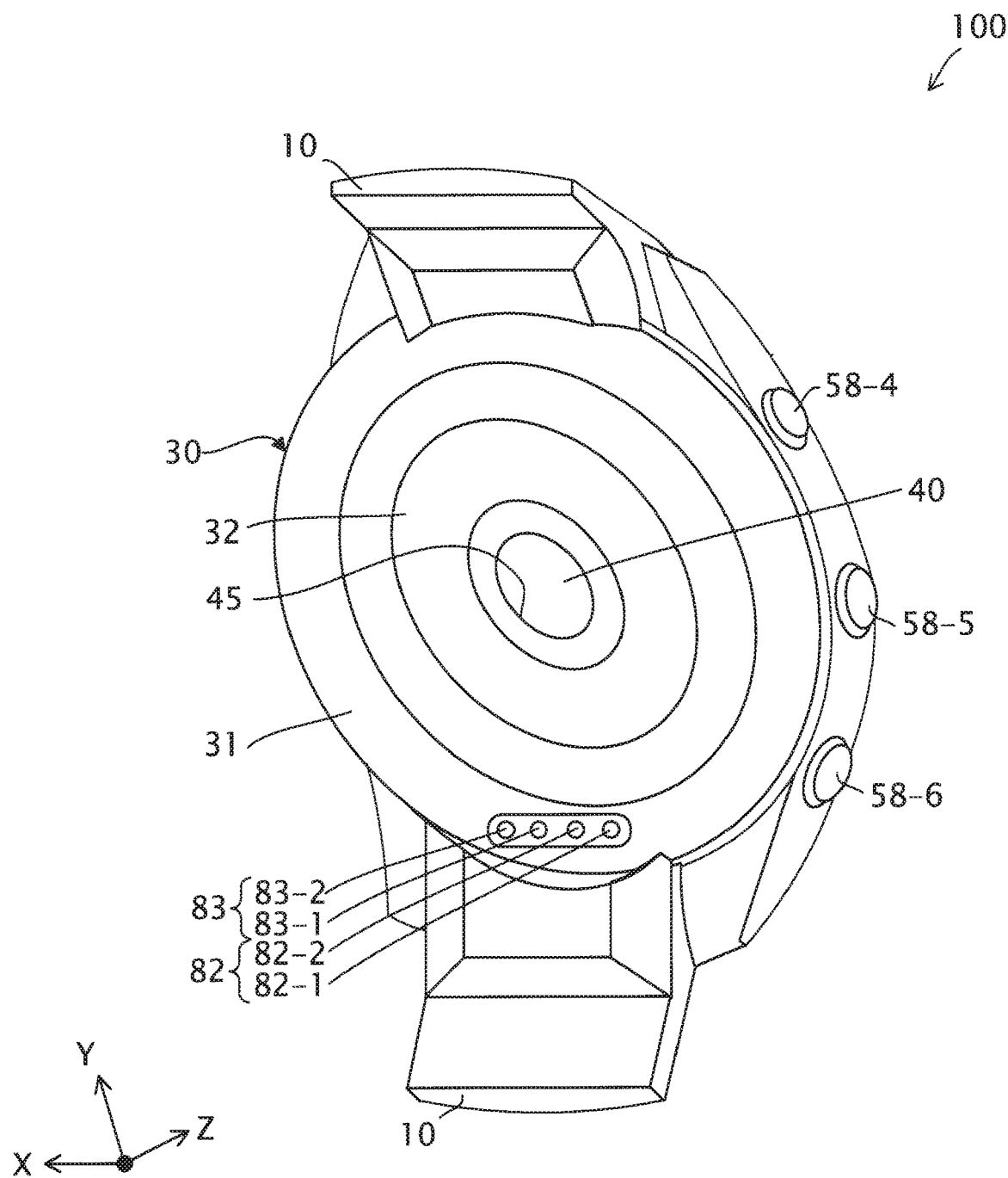
FIG. 2 is a perspective view illustrating an external view of the mobile information processing device shown in FIG. 1 on a back side.

FIG. 2 is a perspective view illustrating an external view of the mobile information processing device shown in FIG. 1 on a back side. As shown in FIG. 2, the device body 30 of the mobile information processing device 100 includes a photosensor 40, buttons 58-4 to 58.6, a communication terminal 82, and a charging terminal 83. Also, the casing 31 includes a protruding portion 32 and a measurement window 45 located at the apex of the protruding portion 32.

The photosensor 40 detects a pulse wave or the like using light. Therefore, the photosensor 40 includes a light receiver 41 and light emitters 42 (refer to FIG. 3), a bandpass filter, an AD (analog/digital) converter, and a circuit that drives the light receiver 41 and the light emitters 42 and detects a pulse or the like. The measurement window 45 is an opening for allowing light emitted from the light emitters 42 to pass through to the outside, and allowing light reflected by human tissue to pass through to the light receiver 41.

The light emitted from the light emitters 42 is reflected by human tissue such as a blood vessel, and is incident on the light receiver 41. The light receiver 41 generates a detection signal by photoelectrically converting the incident light. The bandpass filter restricts the frequency band of the detection signal. The AD converter converts an analog detection signal that is output from the bandpass filter to digital detection data, and outputs the detection data to a CPU (central processing unit) 21 (refer to FIG. 3).

The amount of light absorbed by hemoglobin or the like included in blood that flows in a blood vessel of a living body changes in conjunction with heart beats, and therefore the amount of light incident on the light receiver 41 changes according to the propagation of heart beats, that is, pulses. The CPU 21 measures a pulse rate, a pulse interval (R-R interval), a heart rate variability (HRV), and the like of the user based on the detection data. Also, the CPU 21 can also measure blood pressure or a blood oxygenation level based on a similar principle by appropriately selecting the wavelength of light to be emitted from the light emitters 42. Note that the CPU 21 may be incorporated in a microcomputer along with peripheral circuits.

The communication terminal 82 is a terminal that comes into contact with a cradle for transmitting data when the mobile information processing device 100 communicates with the cradle, and includes a pair of communication terminals 82-1 and 82-2 that are electrically connected to a circuit substrate 20 (refer to FIG. 3) by conductive members such as coil springs. The charging terminal 83 is a terminal that comes into contact with the cradle for receiving supply of electric power when the mobile information processing device 100 is charged, and includes a pair of charging terminals 83-1 and 83-2 that are electrically connected to the circuit substrate 20 by conductive members such as coil springs. The cradle is an apparatus that performs charging of and data transfer with the mobile information processing device 100 without the mobile information processing device 100 being directly connected to a connector or the like conforming to the USB (universal serial bus) standard or the like.

Figure 3:
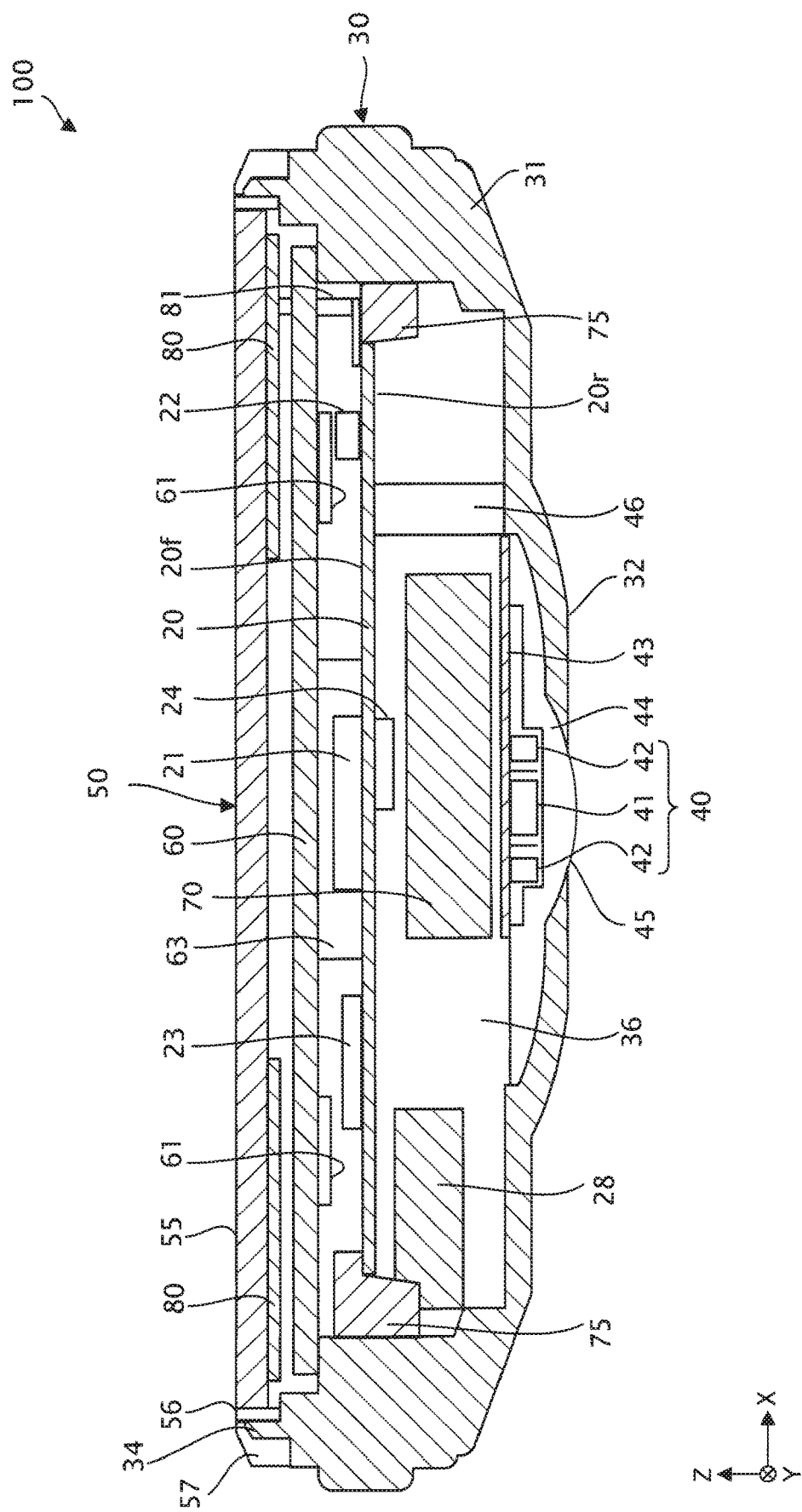
FIG. 3 is a cross-sectional view illustrating an internal structure of the mobile information processing device shown in FIGS. 1 and 2.

FIG. 3 is a cross-sectional view illustrating the internal structure of the mobile information processing device shown in FIGS. 1 and 2. FIG. 3 shows a cross-section of the mobile information processing device 100 in an X-Z plane that passes through the center of the display surface of the display 50. As shown in FIG. 3, the device body 30 of the mobile information processing device 100 includes the circuit substrate 20, the CPU 21, an azimuth sensor 22, an acceleration sensor 23, a GPS (Global Positioning System) module 28, a sensor substrate 43, a transparent cover 44, an inter-substrate connector 46, a windshield plate 55, a joining member 56, an inter-substrate connector 63, a secondary battery 70, a substrate support 75, and an inter-substrate connector 81.

The casing 31 includes a protrusion 34 that protrudes in the positive direction of the Z-axis at an outer edge of the opening of the casing 31. Also, an internal space 36, which is a closed space surrounded by the casing 31 and the windshield plate 55, is provided inside of the casing 31. The display 50 includes a display panel 60, a circuit that drives the display panel 60, and an illuminator 61. The display panel 60 is constituted by an electro-optical panel such as a reflection type liquid crystal display panel or an EPD (electrophoretic display) panel.

The circuit substrate 20 includes a front surface 20$f$ and a back surface 20$r$, and the circuit substrate 20 is attached, at end portions thereof, to the casing 31 by the substrate support 75. The CPU 21, the azimuth sensor 22, the acceleration sensor 23, and the like are mounted on the front surface 20$f$ of the circuit substrate 20, and other circuit elements 24 are mounted on the back surface 20$r$.

The CPU 21 performs various types of control, computations, or data processing according to software stored in a nonvolatile memory or the like that is mounted on the circuit substrate 20. For example, the CPU 21 drives the azimuth sensor 22 or acceleration sensor 23 to measure body motion information, controls the GPS module 28 to measure the position, drives the photosensor 40 to measure a pulse wave or the like, and drives the display 50 to display an image.

The azimuth sensor 22 detects magnetism around the mobile information processing device 100, and specifies the azimuth based on the detected magnetism. The acceleration sensor 23 detects acceleration of the mobile information processing device 100 in three-axis directions that are orthogonal to each other. The GPS module 28 measures the position of the mobile information processing device 100 using satellite signals from GPS satellites, which are one type of position information satellite.

The light receiver 41 and the light emitters 42 of the photosensor 40 are mounted on the sensor substrate 43. In the example shown in FIG. 3, two light emitters 42 are arranged outside the light receiver 41. As a result of arranging the light receiver 41 between two light emitters 42 in this way, the light from outside that enters from an outer peripheral side of the casing 31 is suppressed from entering the light receiver 41, and the influence of the light from outside on the photosensor 40 can be reduced.

The transparent cover 44 is provided in the measurement window 45, and is a transparent member that allows light emitted from the light emitters 42 to pass through to the outside, allows light reflected by human tissue to pass through toward the light receiver 41, and suppresses foreign matter from entering the casing 31. For example, the transparent cover 44 is made of a photo-curing resin. As shown in FIG. 3, the transparent cover 44 protrudes from the apex of the protruding portion 32 of the casing 31. The inter-substrate connector 46 is constituted by a flexible substrate or the like, and electrically connects the sensor substrate 43 to the back surface 20$r$ of the circuit substrate 20.

The windshield plate 55 is arranged so as to close the opening of the casing 31, and is attached to the inner edge of the protrusion 34 of the casing 31. The windshield plate 55 keeps foreign matter from entering the inside of the mobile information processing device 100 from the outside, and has a function of mitigating an impact applied to the mobile information processing device 100 from the outside. Glass, an acrylic resin, polycarbonate, or the like can be used as the material of the windshield plate 55.

The joining member 56 is a packing, an adhesive, or the like that is used to improve the airtightness and the liquid-tightness. The illuminator 61 is electrically connected to the front surface 20$f$ of the circuit substrate 20, and functions as a backlight of the display panel 60. The inter-substrate connector 63 electrically connects the display panel 60 to the front surface 20$f$ of the circuit substrate 20. The inter-substrate connector 81 electrically connects the solar cell 80 to the front surface 20$f$ of the circuit substrate 20. The substrate support 75 is a member for supporting the circuit substrate 20.

First Embodiment

Figure 4:
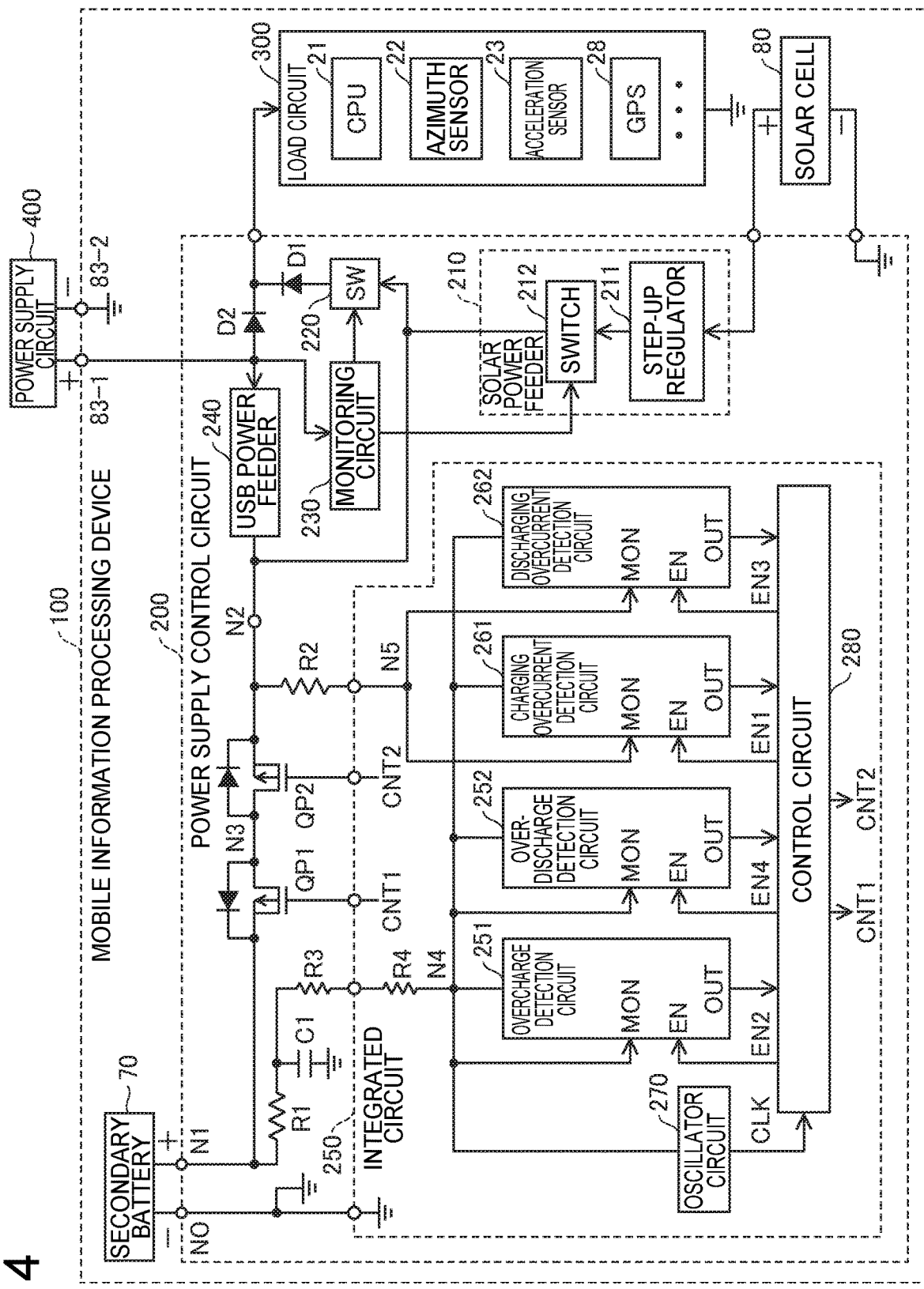
FIG. 4 is a circuit diagram illustrating an exemplary configuration of a mobile information processing device according to a first embodiment of the invention.

FIG. 4 is a circuit diagram illustrating an exemplary configuration of the mobile information processing device according to a first embodiment of the invention. As shown in FIG. 4, the mobile information processing device 100 includes the secondary battery 70, the solar cell 80, a power supply control circuit 200, and a load circuit 300. Note that some of the constituent elements shown in FIG. 4 may be omitted or changed, or another constituent element may be added to the constituent elements shown in FIG. 4.

Also, the mobile information processing device 100 can be connected to a power supply circuit 400, which is an external power supply provided in a cradle or the lie, via the pair of charging terminals 83-1 and 83-2. The power supply circuit 400 is connected to a connector or the like conforming to the USB standard or the like, and supplies a stabilized voltage of 5V.

The secondary battery 70 includes a positive electrode (+) connected to a first node N1, and a negative electrode (−) connected to a common potential node (power supply ground) N0, and stores electric power generated by the solar cell 80 or the power supply circuit 400. A chargeable battery such as a lithium-ion battery or a lithium polymer battery is used as the secondary battery 70, for example. The maximum charging voltage of the secondary battery 70 is about 4.2V, for example.

The power supply control circuit 200 includes a solar power feeder 210, a switch circuit (SW) 220, a monitoring circuit 230, a USB power feeder 240, an overcharge detection circuit 251, an over-discharge detection circuit 252, a charging overcurrent detection circuit 261, a discharging overcurrent detection circuit 262, an oscillator circuit 270, a control circuit 280, P-ch power MOS field effect transistors QP1 and QP2, diodes D1 and D2, resistors R1 and R2, and a capacitor C1. Note that resistors R3 and R4 indicate interconnect resistances.

Here, the overcharge detection circuit 251, the over-discharge detection circuit 252, the charging overcurrent detection circuit 261, the discharging overcurrent detection circuit 262, the oscillator circuit 270, the control circuit 280, the transistors QP1 and QP2, the resistors R1 and R2, and the capacitor C1 constitute a battery protection circuit that monitors the state of the secondary battery 70 and opens and closes the charging path and the discharging path in order to prevent the secondary battery 70 from being over-discharged or overcharged for protection Also, the battery protection circuit constitutes a battery pack along with the secondary battery 70. Furthermore, at least some of the overcharge detection circuit 251, the over-discharge detection circuit 252, the charging overcurrent detection circuit 261, the discharging overcurrent detection circuit 262, the oscillator circuit 270, and the control circuit 280 may be incorporated in an integrated circuit (IC) 250, or the integrated circuit 250 may include another constituent element.

The solar power feeder 210 is a power feeding circuit that supplies the electric power generated by a power generator such as the solar cell 80 to the secondary battery 70 and the load circuit 300, and includes a step-up regulator 211 and a switch circuit 212. Because the output voltage of the solar cell 80 is too low to charge the secondary battery 70, the step-up regulator 211 steps-up and stabilizes the output voltage of the solar cell 80 to a voltage with which the secondary battery 70 can be charged.

The switch circuits 212 and 220 are each constituted by a transistor, for example. When the switch circuit 212 is turned on, the output voltage of the step-up regulator 211 is supplied to the switch circuit 220, and is also supplied to the secondary battery 70 via a second node N2 and transistors QP2 and QP1. When the switch circuit 220 is turned on, the output voltage of the solar power feeder 210 is supplied to the load circuit 300 via the diode D1 for backflow prevention.

The step-up regulator 211 performs voltage conversion according to MPPT (Maximum Power Point Tracking), for example. Accordingly, the solar power feeder 210 supplies a voltage in a predetermined range to the secondary battery 70. Note that, if the amount of light incident on the solar cell 80 is small, and the output voltage of the solar cell 80 is too low to be stepped up to a voltage with which the secondary battery 70 can be charged, the solar power feeder 210 stops operating.

If the voltage between the charging terminal 83-1 and the charging terminal 83-2 is higher than a threshold value, the monitoring circuit 230 determines that the power supply circuit 400 is connected to the mobile information processing device 100 and is supplying electric power, and performs control such that the switch circuits 212 and 220 are turned off. In this case, the voltage supplied from the power supply circuit 400 is supplied to the USB power feeder 240, and is also supplied to the load circuit 300 via the diode D2 for backflow prevention. In other cases, the monitoring circuit 230 performs control such that the switch circuits 212 and 220 are turned on.

The USB power feeder 240 is a power feeding circuit that supplies the electric power supplied from the external power supply circuit 400 to the secondary battery 70 and the load circuit 300, and supplies a current or a voltage for charging the secondary battery 70 to the secondary battery 70 via the second node N2 and the transistors QP2 and QP1. The USB power feeder 240 may limit the current supplied to the secondary battery 70 according to the voltage of the secondary battery 70.

In this way, the secondary battery 70 stores the electric power supplied from the solar power feeder 210 or the USB power feeder 240, and can supply the stored electric power to the load circuit 300 as needed. The load circuit 300 may include electronic circuits such as the CPU 21 that are supplied with electric power from the secondary battery 70, and the azimuth sensor 22, the acceleration sensor 23, the GPS module 28, the photosensor 40, and the display 50 that are controlled by the electronic circuits. Alternatively, the solar power feeder 210 or the power supply circuit 400 can supply electric power to the load circuit 300.

The transistors QP1 and QP2 are connected in series between the first node N1 and the second node N2. The transistor QP1 is used for controlling discharging and has a source and a drain that are respectively connected to the first node N1 and the third node N3, and a back gate connected to the first node N1. Note that, in this application, out of the two terminals of a transistor, that constitute a source and a drain, the one connected to the back gate is defined as the source. The transistor QP1 includes a parasitic diode whose anode and cathode are respectively connected to the third node N3 and the first node N1.

Also, the transistor QP2 is used to control charging, and has a source, a drain, and a back gate respectively connected to the second node N2, the third node N3, and the second node N2. The transistor QP2 includes a parasitic diode whose anode and cathode are respectively connected to the third node N3 and the second node N2. The transistors QP1 and QP2 are turned on, according to control signals CNT1 and CNT2 that are applied to respective gates, when the secondary battery 70 is charged and discharged.

Note that, instead of the P-ch power MOS field effect transistors QP1 and QP2, an N-ch power MOS field effect transistor may be used. In this case, two N-ch power MOS field effect transistors may be connected in series between a negative electrode (−) and a common potential node N0 of the secondary battery 70. Also, bipolar transistors may be used instead of the power MOS field effect transistors.

The resistor R1 and the capacitor C1 are connected in series between the first node N1 and the common potential node N0. The resistor R1 and the capacitor C1 constitute a low-pass filter that smooths out a steep change in voltage, and the voltage at a connection point between the resistor R1 and the capacitor C1 is supplied to a fourth node N4 in the integrated circuit 250 via interconnect resistors R3 and R4. Also, the resistor R2 is connected between the second node N2 and the integrated circuit 250 in order to protect the integrated circuit 250 from electrostatic discharge, and the voltage at the second node N2 is supplied to a fifth node N5 via the resistor R2.

Integrated Circuit

In the example shown in FIG. 4, the integrated circuit 250 includes the overcharge detection circuit 251, the over-discharge detection circuit 252, the charging overcurrent detection circuit 261, the discharging overcurrent detection circuit 262, the oscillator circuit 270, and the control circuit 280. The integrated circuit 250 operates using, as the power supply voltage, the voltage supplied to the fourth node N4 from the secondary battery 70 via the first node N1 connected to one end (positive electrode) of the secondary battery 70, and the resistors R1, R3, and R4.

The overcharge detection circuit 251 and the over-discharge detection circuit 252 each include a voltage dividing circuit that divides the voltage supplied to a detection terminal MON from the first node N1 via the resistors R1, R3, and R4, and a comparator that compares a voltage obtained by voltage-division performed by the voltage dividing circuit with a reference voltage. Note that the resistance values of the resistors R1, R3, and R4 are also elements used for determining the voltage dividing ratio of the voltage dividing circuit. The overcharge detection circuit 251 and the over-discharge detection circuit 252, which operate intermittently or continuously, each detect the voltage at the first node N1, generate an output signal, and output the output signal from an output terminal OUT.

The second node N2 is connected to the solar power feeder 210 and the USB power feeder 240, and is also connected to the load circuit 300 via the switch circuit 220 and the diode D1. When the secondary battery 70 is charged by the solar power feeder 210 or the USB power feeder 240, a current flows from the second node N2 to the first node N1 via the transistors QP2 and QP1 having respective on-resistances.

Also, when electricity is discharged from the secondary battery 70 to the load circuit 300, a current flows from the first node N1 to the second node N2 via the transistors QP1 and QP2 having the respective on-resistances. Accordingly, if the on-resistances of the transistors QP1 and QP2 are known, the current flowing between the first node N1 and the second node N2 can be detected based on the difference between potentials at the first node N1 and the second node N2.

The charging overcurrent detection circuit 261 and the discharging overcurrent detection circuit 262 each include a first voltage dividing circuit that divides the voltage supplied to a power supply terminal from the first node N1 via the resistors R1, R3, and R4, a second voltage dividing circuit that divides the voltage supplied to a detection terminal MON from the second node N2 via the resistor R2, and a comparator that compares the difference between the voltage obtained by voltage-division performed by the first voltage dividing circuit and the voltage obtained by voltage-division performed by the second voltage dividing circuit with a reference voltage.

Note that the resistance values of the resistors R1, R3, and R4 are also elements used for determining the voltage dividing ratio of the first voltage dividing circuit. Also, the resistance value of the resistor R2 is also an element used for determining the voltage dividing ratio of the second voltage dividing circuit. The charging overcurrent detection circuit 261 and the discharging overcurrent detection circuit 262, which operate intermittently, each detect the current flowing between the first node N1 and the second node N2, generate an output signal, and output the output signal from an output terminal.

Here, one of the charging overcurrent detection circuit 261 and the discharging overcurrent detection circuit 262 corresponds to a first current detection circuit that detects the current flowing between the first node N1 and the second node N2 and generates the output signal when the first enable signal EN1 is in an activated state, and stops the current detection operation when the first enable signal EN1 is in a deactivated state.

Also, one of the overcharge detection circuit 251 and the over-discharge detection circuit 252 corresponds to a first voltage detection circuit that detects the voltage at the first node N1 and generates the output signal when a second enable signal EN2 is in an activated state, and stops the voltage detection operation when the second enable signal EN2 is in a deactivated state.

On the other hand, the other of the charging overcurrent detection circuit 261 and the discharging overcurrent detection circuit 262 corresponds to a second current detection circuit that detects the current flowing between the first node N1 and the second node N2 and generates the output signal when the third enable signal EN3 is in an activated state, and stops the current detection operation when the third enable signal EN3 is in a deactivated state.

Also, the other of the overcharge detection circuit 251 and the over-discharge detection circuit 252 corresponds to a second voltage detection circuit that detects the voltage at the first node N1 and generates the output signal when a fourth enable signal EN4 is in an activated state, and stops the voltage detection operation when the fourth enable signal EN4 is in a deactivated state.

In the following, the charging overcurrent detection circuit 261 is assumed to correspond to the first current detection circuit, and the overcharge detection circuit 251 is assumed to correspond to the first voltage detection circuit, as an example. Also, the discharging overcurrent detection circuit 262 is assumed to correspond to the second current detection circuit, and the over-discharge detection circuit 252 is assumed to correspond to second voltage detection circuit.

The oscillator circuit 270 is constituted by a CR oscillator circuit, for example, and generates a clock signal CLK that has a predetermined frequency by performing oscillation operation. The control circuit 280 is constituted by a logic circuit or the like including a combinational circuit or a sequential circuit, and generates the first enable signal EN1 to the fourth enable signal EN4 in synchronization with the clock signal CLK supplied from the oscillator circuit 270. Note that, when the overcharge detection circuit 251 and the over-discharge detection circuit 252 are caused to operate continuously, the control circuit 280 activates the second enable signal EN2 and the fourth enable signal EN4 continuously.

The control circuit 280 supplies the first enable signal EN1 to the charging overcurrent detection circuit 261 supplies the second enable signal EN2 to the overcharge detection circuit 251, supplies the third enable signal EN3 to the discharging overcurrent detection circuit 262, and supplies the fourth enable signal EN4 to the over-discharge detection circuit 252. Also, the control circuit 280 generates the control signals CNT1 and CNT2 for respectively controlling the transistors QP1 and QP2 based on the output signals from the overcharge detection circuit 251, the over-discharge detection circuit 252, the charging overcurrent detection circuit 261, and the discharging overcurrent detection circuit 262.

The overcharge detection circuit 251 operates when the second enable signal EN2 is in an activated state, detects an overcharged state when the voltage at the first node N1 is higher than a predetermined voltage VA, and activates the output signal. The overcharge detection circuit 251 deactivates the output signal when the voltage at the first node N1 is lower than the predetermined voltage VA.

When the overcharge detection circuit 251 has detected the overcharged state over a predetermined period, the control circuit 280 performs control such that the transistor QP2 is turned off, and stops charging of the secondary battery 70. Note that the secondary battery 70 can supply a current to the load circuit 300 via the parasitic diode of the transistor QP2.

Also, the over-discharge detection circuit 252 operates when the fourth enable signal EN4 is in an activated state, detects an over-discharged state when the voltage at the first node N1 is lower than a predetermined voltage VB, and activates the output signal. The over-discharge detection circuit 252 deactivates the output signal when the voltage at the first node N1 is higher than the predetermined voltage VB (VA>VB).

When the over-discharge detection circuit 252 has detected the over-discharged state over a predetermined period, the control circuit 280 performs control such that the transistor QP1 is turned off, and stops supply of a current from the secondary battery 70 to the load circuit 300. Note that the secondary battery 70 can be charged via the parasitic diode of the transistor QP1.

The charging overcurrent detection circuit 261 operates when the first enable signal EN1 is in an activated state, detects a charging overcurrent when the current flowing from the second node N2 to the first node N1 is larger than a predetermined current IA, and activates the output signal. The charging overcurrent detection circuit 261 deactivates the output signal when the current flowing from the second node N2 to the first node N1 is smaller than the predetermined current IA.

When the charging overcurrent detection circuit 261 has detected the charging overcurrent over a predetermined period, the control circuit 280 performs control such that the transistor QP2 is turned off, and stops charging of the secondary battery 70. Note that the secondary battery 70 can supply a current to the load circuit 300 via the parasitic diode of the transistor QP2.

Also, the discharging overcurrent detection circuit 262 operates when the third enable signal EN3 is in an activated state, detects a discharging overcurrent when the current flowing from the first node N1 to the second node N2 is larger than a predetermined current IB, and activates the output signal. The discharging overcurrent detection circuit 262 deactivates the output signal when the current flowing from the first node N1 to the second node N2 is smaller than the predetermined current IB.

When the discharging overcurrent detection circuit 262 has detected a discharging overcurrent over a predetermined period, the control circuit 280 performs control such that the transistor QP1 is turned off, and stops supply of a current from the secondary battery 70 to the load circuit 300. Note that the secondary battery 70 can be charged via the parasitic diode of the transistor QP1.

Operation Timing

Figure 5:
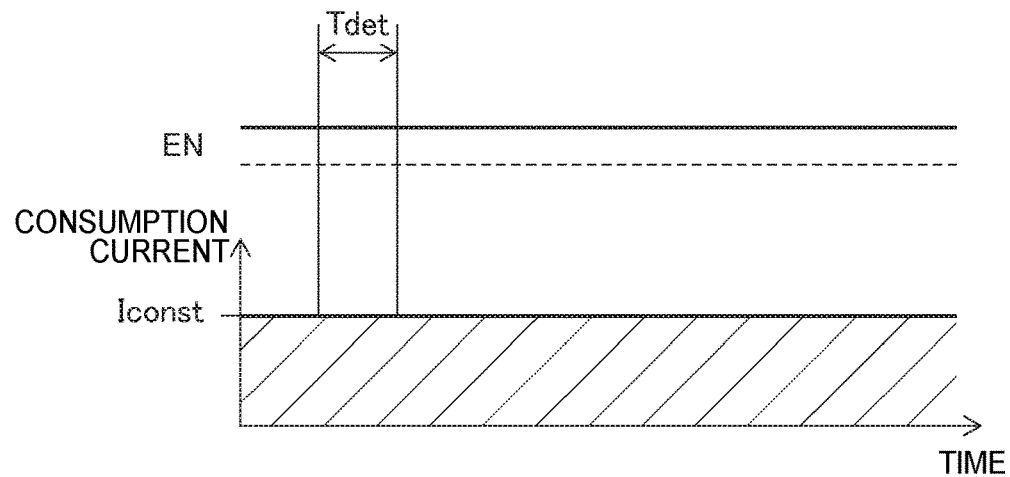
FIG. 5 is a timing chart for describing consumption current during a continuous operation.

FIG. 5 is a timing chart for describing a consumption current in a continuous operation. In FIG. 5, an enable signal EN to be supplied to the first or second current detection circuit is continuously activated to a high level, in a period in which the mobile information processing device 100 is operating, and the first or second current detection circuit operates continuously. Accordingly, regardless of the detection period Tdet for fetching the output signal of the first or second current detection circuit, a certain consumption current Iconst flows constantly, and therefore the power consumption increases.

Figure 6:
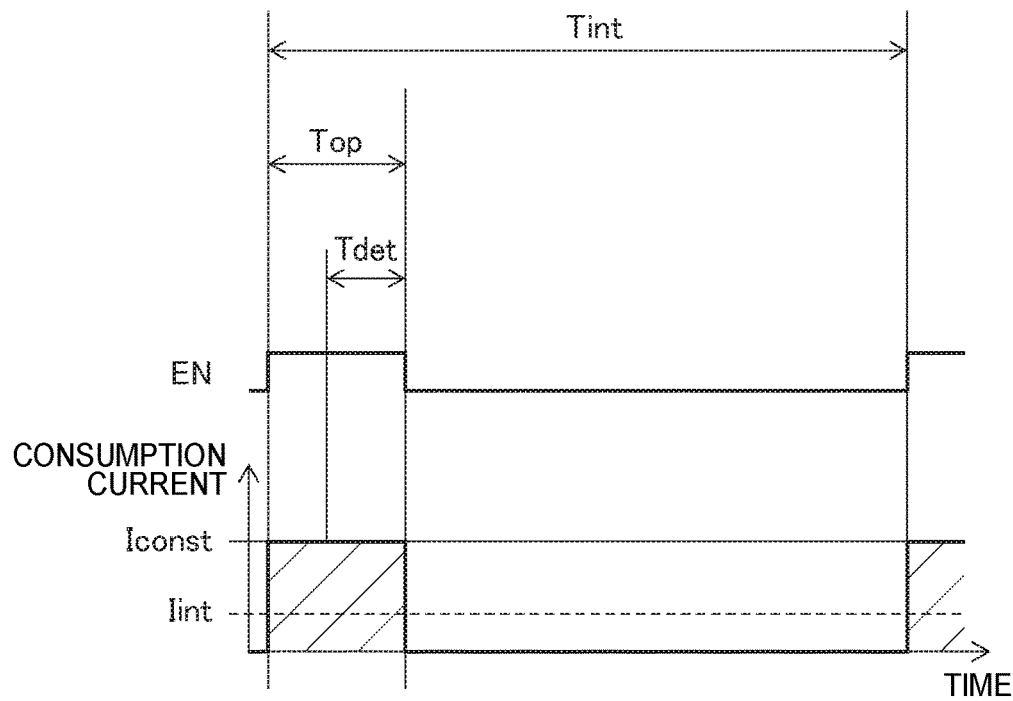
FIG. 6 is a tithing chart for describing consumption current during an intermittent operation.

FIG. 6 is a timing chart for describing a consumption current in an intermittent operation. In FIG. 6, the enable signal EN to be supplied to the first or second current detection circuit is activated to a high level in a detection circuit operating period Top, which is a portion of an intermittent period Tint, and is deactivated to a low level in other periods.

After the enable signal EN is activated and the output signal of the comparator of the first or second current detection circuit stabilizes, the control circuit 280 fetches the output signal of the first or second current detection circuit in a detection period Tdet, which is a portion of the detection circuit operating period Top. As a result of operating intermittently, the average value Iint of the consumption current of the first or second current detection circuit can be substantially reduced from the consumption current Iconst during a continuous operation, as shown in the following equation.

$$Iint=Iconst \times Top/Tint$$

Therefore, the control circuit 280 causes the overcharge detection circuit 251, the over-discharge detection circuit 252, the charging overcurrent detection circuit 261, and the discharging overcurrent detection circuit 262 to operate intermittently, or causes the charging overcurrent detection circuit 261 and discharging overcurrent detection circuit 262 to operate intermittently while causing the overcharge detection circuit 251 and the over-discharge detection circuit 252 to operate continuously. As a result, the power consumption of the integrated circuit 250 can be reduced, and furthermore, the power consumption of the mobile information processing device 100 can be reduced. Note that a configuration may be adopted in which, when an overcurrent is detected, the first or second current detection circuit is caused to operate continuously.

Figure 7:
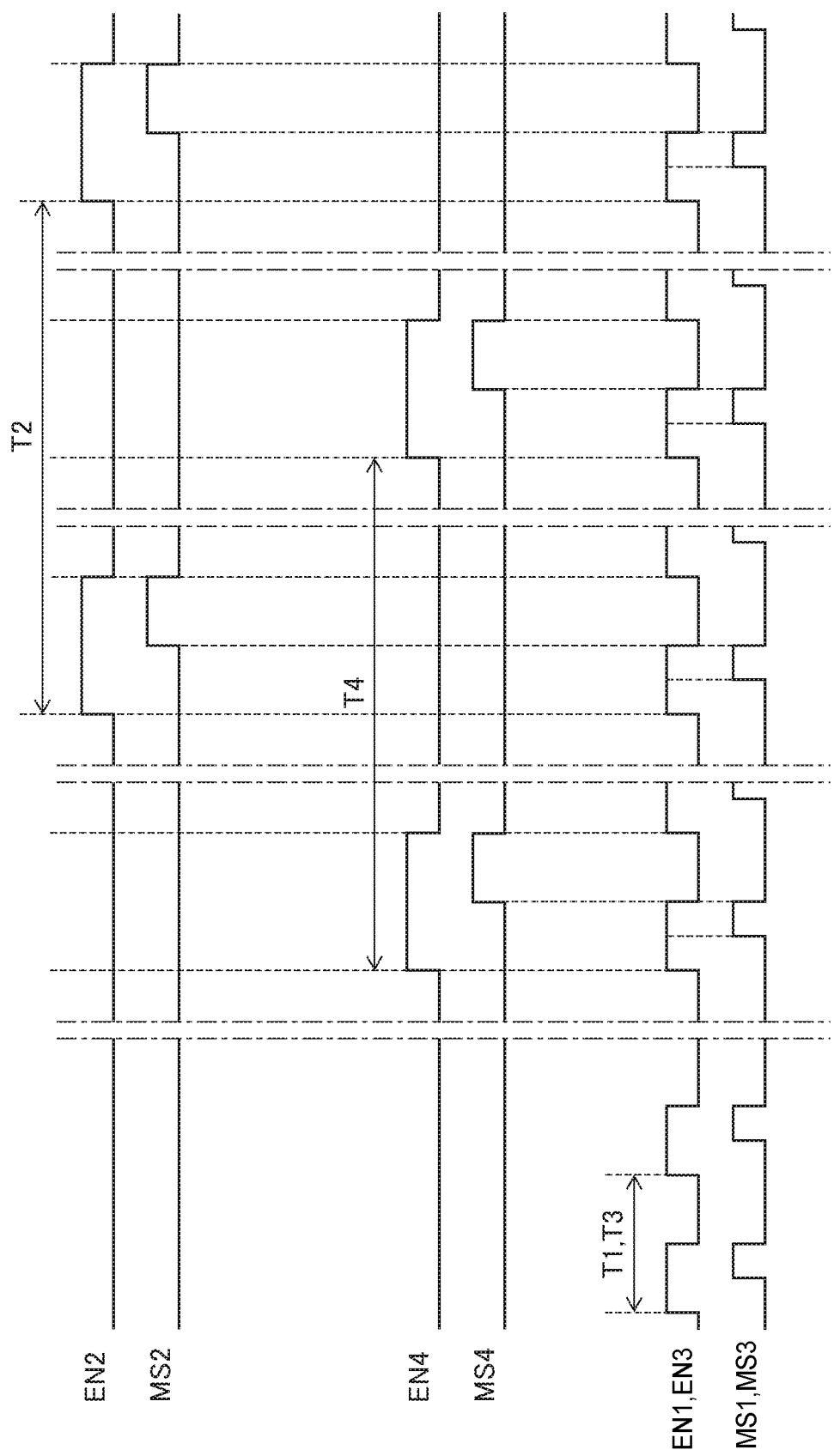
FIG. 7 is a timing chart illustrating an exemplary operation timing of a battery protection circuit.

FIG. 7 is a timing chart illustrating an exemplary operation timing of a battery protection circuit. In FIG. 7, the second enable signal EN2 and a signal MS2 for setting a detection period for fetching the output signal of the overcharge detection circuit 251, the fourth enable signal EN4 and a signal MS4 for setting a detection period for fetching the output signal of the over-discharge detection circuit 252, the first enable signal EN1 and a signal MS1 for setting a detection period for fetching the output signal of the charging overcurrent detection circuit 261, and the third enable signal EN3 and a signal MS3 for setting a detection period for fetching the output signal of the discharging overcurrent detection circuit 262 are shown.

In the example shown in FIG. 7, the control circuit 280 causes the overcharge detection circuit 251, the over-discharge detection circuit 252, the charging overcurrent detection circuit 261, and the discharging overcurrent detection circuit 262 to operate intermittently. In this case, the second enable signal EN2 has an intermittent period T2 in which an activated state at a high level and a deactivated state at a low level are included, the fourth enable signal EN4 has an intermittent period T4 in which an activated state at a high level and a deactivated state at a low level are included, the first enable signal EN1 has an intermittent period T1 in which an activated state at a high level and a deactivated state at a low level are included, and the third enable signal EN3 has an intermittent period T3 in which an activated state at a high level and a deactivated state at a low level are included.

Also, as shown in FIG. 7, the control circuit 280 may cause the first enable signal EN1 to be supplied to the charging overcurrent detection circuit 261 and the third enable signal EN3 to be supplied to the discharging overcurrent detection circuit 262 to transition at the same time. For example, the first enable signal EN1 and the third enable signal EN3 may be caused to transition from a deactivated state to an activated state at the same time, and the first enable signal EN1 and the third enable signal EN3 may be caused to transition from an activated state to a deactivated state at the same time. With this, the period of current detection in each of the charging overcurrent detection circuit 261 and the discharging overcurrent detection circuit 262 can be reduced.

If the charging overcurrent detection circuit 261 or the discharging overcurrent detection circuit 262 is caused to operate intermittently, the consumption current fluctuates when the circuit is started or stopped, and the voltage at the first node N1 fluctuates, and as a result, the detection accuracy of the overcharge detection circuit 251 and the over-discharge detection circuit 252 is affected. Therefore, the control circuit 280 fetches the output signal of the overcharge detection circuit 251 in a period other than the period in which the first enable signal EN1 or the third enable signal EN3 transitions from a deactivated state to an activated state.

That is, the control circuit 280 does not fetch the output signal of the overcharge detection circuit 251 in a period in which the first enable signal EN1 or the third enable signal EN3 transitions from a deactivated state to an activated state. Alternatively, the control circuit 280 does not cause the first enable signal EN1 and the third enable signal EN3 to transition from a deactivated state to an activated state when the output signal of the overcharge detection circuit 251 is fetched.

Accordingly, even if the consumption current fluctuates when the charging overcurrent detection circuit 261 or the discharging overcurrent detection circuit 262 is started, and the voltage at the first node N1 fluctuates, the output signal of the overcharge detection circuit 251 is fetched in a period other than the period in which the voltage fluctuates, and as a result, the detection accuracy can be improved.

In this case, the control circuit 280 may fetch the output signal of the overcharge detection circuit 251 in a period other than the period in which the first enable signal EN1 or third enable signal EN3 transitions from an activated state to a deactivated state. Accordingly, even if the consumption current fluctuates when the charging overcurrent detection circuit 261 or the discharging overcurrent detection circuit 262 is stopped, and the voltage at the first node N1 fluctuates, the output signal of the overcharge detection circuit 251 is fetched in a period other than the period in which the voltage fluctuates, and as a result, the detection accuracy can be improved.

For example, the control circuit 280 may fetch the output signal of the overcharge detection circuit 251 after a first period has elapsed from when the first enable signal EN1 or the third enable signal EN3 transitioned from a deactivated state to an activated state, and may fetch the output signal of the overcharge detection circuit 251 after a second period has elapsed from when the first enable signal EN1 or the third enable signal EN3 transitioned from an activated state to a deactivated state.

In this case, it is desirable that the first period is longer than the second period. Because the time it takes for the voltage at the first node N1 to stabilize is longer when the charging overcurrent detection circuit 261 or the discharging overcurrent detection circuit 262 is started than when the circuit is stopped, as a result of lengthening the period from when the first enable signal EN1 transitions until when the output signal of the overcharge detection circuit 251 is fetched, the output signal of the overcharge detection circuit 251 can be fetched after the voltage at the first node N1 has stabilized.

Similarly, the control circuit 280 fetches the output signal of the over-discharge detection circuit 252 in a period other than the period in which the first enable signal EN1 or the third enable signal EN3 transitions from a deactivated state to an activated state. Accordingly, even if the consumption current fluctuates when the charging overcurrent detection circuit 261 or the discharging overcurrent detection circuit 262 is started, and the voltage at the first node N1 fluctuates, the output signal of the over-discharge detection circuit 252 is fetched in a period other than the period in which the voltage fluctuates, and as a result, the detection accuracy can be improved.

In this case, the control circuit 280 may fetch the output signal of the over-discharge detection circuit 252 in a period other than the period in which the first enable signal EN1 or third enable signal EN3 transitions from an activated state to a deactivated state. Accordingly, even if the consumption current fluctuates when the charging overcurrent detection circuit 261 or the discharging overcurrent detection circuit 262 is stopped, and the voltage at the first node N1 fluctuates, the output signal of the over-discharge detection circuit 252 is fetched in a period other than the period in which the voltage fluctuates, and as a result, the detection accuracy can be improved.

On the other hand, if the overcharge detection circuit 251 or the over-discharge detection circuit 252 is caused to operate intermittently, the consumption current fluctuates when the circuit is started or stopped, the current flowing between the first node N1 and the second node N2 fluctuates, and as a result, the detection accuracy of the charging overcurrent detection circuit 261 and the discharging overcurrent detection circuit 262 is affected. Therefore, the control circuit 280 fetches the output signal of the charging overcurrent detection circuit 261 in a period other than the period in which the second enable signal EN2 or the fourth enable signal EN4 transitions from a deactivated state to an activated state.

That is, the control circuit 280 does not fetch the output signal of the charging overcurrent detection circuit 261 in a period in which the second enable signal EN2 or the fourth enable signal EN4 transitions from a deactivated state to an activated state. Alternatively, the control circuit 280 does not cause the second enable signal EN2 and the fourth enable signal EN4 to transition from a deactivated state to an activated state when the output signal of the charging overcurrent detection circuit 261 is fetched.

Accordingly, even if the consumption current fluctuates when the overcharge detection circuit 251 or the over-discharge detection circuit 252 is started, and the current flowing between the first node N1 and the second node N2 fluctuates, the output signal of the charging overcurrent detection circuit 261 is fetched in a period other than the period in which the current fluctuates, and as a result, the detection accuracy can be improved.

In this case, the control circuit 280 may fetch the output signal of the charging overcurrent detection circuit 261 in a period other than the period in which the second enable signal EN2 or the fourth enable signal EN4 transitions from an activated state to a deactivated state. Accordingly, even if the consumption current fluctuates when the overcharge detection circuit 251 or the over-discharge detection circuit 252 is stopped, and the current flowing between the first node N1 and the second node N2 fluctuates, the output signal of the charging overcurrent detection circuit 261 is fetched in a period other than the period in which the current fluctuates, and as a result, the detection accuracy can be improved.

Similarly, the control circuit 280 fetches the output signal of the discharging overcurrent detection circuit 262 in a period other than the period in which the second enable signal EN2 or the fourth enable signal EN4 transitions from a deactivated state to an activated state. Accordingly, even if the consumption current fluctuates when the overcharge detection circuit 251 or the over-discharge detection circuit 252 is activated, and the current flowing between the first node N1 and the second node N2 fluctuates, the output signal of the discharging overcurrent detection circuit 262 is fetched in a period other than the period in which the current fluctuates, and as a result, the detection accuracy can be improved.

In this case, the control circuit 280 may fetch the output signal of the discharging overcurrent detection circuit 262 in a period other than the period in which the second enable signal EN2 or the fourth enable signal EN4 transitions from an activated state to a deactivated state. Accordingly, even if the consumption current fluctuates when the overcharge detection circuit 251 or the over-discharge detection circuit 252 is stopped, and the current flowing between the first node N1 and the second node N2 fluctuates, the output signal of the discharging overcurrent detection circuit 262 is fetched in a period other than the period in which the current fluctuates, and as a result, the detection accuracy can be improved.

Also, according to the present embodiment, in a battery pack including the integrated circuit 250 that includes at least the overcharge detection circuit 251 or the over-discharge detection circuit 252, and the charging overcurrent detection circuit 261 or the discharging overcurrent detection circuit 262, as a result of improving the detection accuracy while reducing the power consumption of the integrated circuit, the consumption of the secondary battery 70 can be suppressed.

Second Embodiment

In a second embodiment, the solar power feeder 210 shown in FIG. 4 functions as a power feeding circuit that transforms or stabilizes the voltage supplied from a power generator other than the solar cell 80. In other respects, the second embodiment may be similar to the first embodiment. A vibration power generator, a temperature difference power generator, or the like can be used as the power generator in the second embodiment.

The vibration power generator includes a power generator of an electromagnetic induction type, piezoelectric type, electrostatic type, or the like. A rotary power generator that is used in a wrist apparatus such as a sport watch comes under the category of an electromagnetic induction type power generator, for example. In a rotary power generator, a built-in rotating weight is rotated due to motion of a user's arm and the rotating speed of the weight is accelerated by gears, which causes a power generation rotor to rotate at an extremely high speed. A capacitor is charged by the generated electric power.

A piezoelectric type power generator uses the electromotive force generated when a piezoelectric material such as a piezoelectric element deforms due to vibration, as electric power. Also, an electrostatic type power generator uses a structure in which two planar electrodes oppose each other, and uses the electromotive force generated when the positional relationship between the two electrodes changes due to vibration as electric power.

Figure 8:
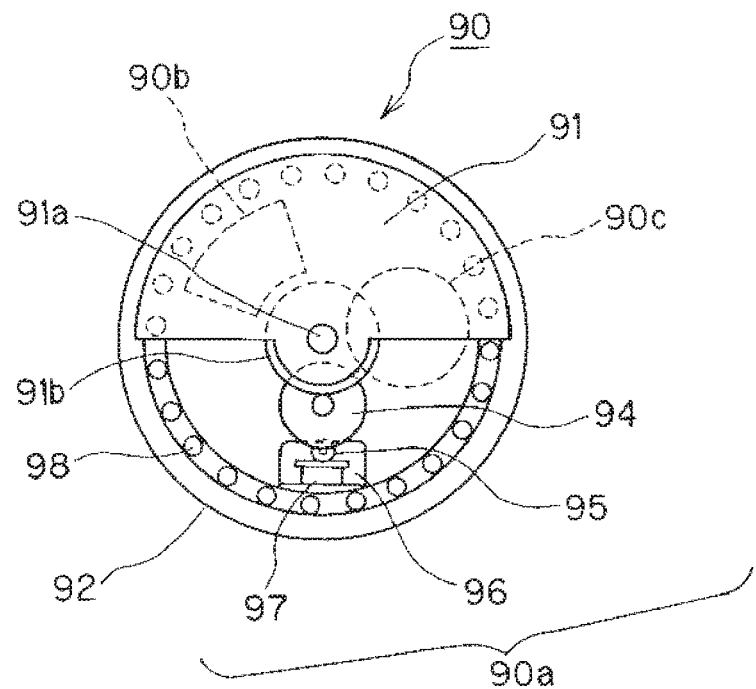
FIG. 8 is a plan view illustrating an exemplary configuration of a rotary power generator.
Figure 9:
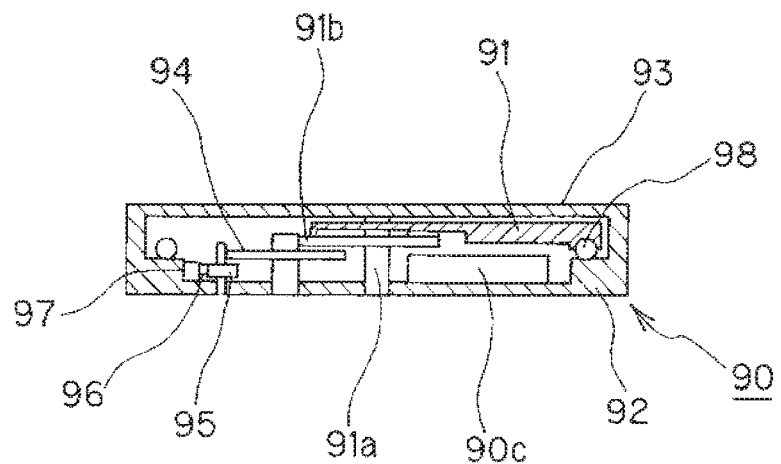
FIG. 9 is a cross-sectional view of the rotary power generator shown in FIG. 8.

FIG. 8 is a plan view illustrating an exemplary configuration of the rotary power generator, and FIG. 9 is a cross-sectional view of the rotary power generator shown in FIG. 8. As shown in FIG. 8, the rotary power generator 90 includes a power generation mechanism 90a, a voltage control circuit 90b, and a capacitor 90c. The power generation mechanism 90a is configured to generate power using rotation of a rotating weight 91 caused by the motions of a user's arm.

As shown in FIGS. 8 and 9, the power generation mechanism 90a is provided with a case including a base 92 and a cover 93, and a rotating weight 91 that rotates about a rotating shaft 91a fixed to the base 92 is provided inside this case. The rotating weight 91 is shaped such that the center of gravity thereof is largely shifted from the position of the rotating shaft 91a. Furthermore, a gear 91b is fixed to the rotating weight 91, and the gear 91b rotates along with the rotation of the rotating weight 91.

Also, a relay gear 94 that is rotated by the rotation of the gear 91b, and a power generation rotor 95 that is rotated by the rotation of the relay gear 94 are provided inside the case. The gear 91b and the relay gear 94 constitute a rotational motion transmission mechanism, which is referred to as a train wheel mechanism in general. The power generation rotor 95 includes a rotating shaft and permanent magnets that are fixed to the rotating shaft such that N poles and S poles are arranged alternatingly.

Furthermore, a substantially C-shaped stator 96 made of a high permeability material is arranged such that the power generation rotor 95 is sandwiched between two ends of the stator 96, and a conducting wire is wound around the stator 96 to form a coil 97 at the central portion thereof. Also, a bearing 98 that rotatably supports the rotating weight 91 is arranged between the rotating weight 91 and the base 92, and the voltage control circuit 90b and the capacitor 90c are arranged in a hollow space of the base 92 around the rotating shaft 91a.

When the rotating weight 91 is rotated due to the motion of a user's arm or the like, in such a power generation mechanism 90a, this rotational motion is transmitted to the power generation rotor 95 so as to rotate the power generation rotor 95, and the permanent magnets of the power generation rotor 95 are also rotated. Accordingly, the N poles and the S poles alternatingly oppose the two ends of the stator 96, and when the N pole and the S pole of one of the permanent magnets respectively oppose the two ends of the stator 96, a magnetic flux from the N pole of the permanent magnet passes through the inside of the stator 96 and reaches the S pole.

Accordingly, the magnetic flux passes through the coil 97 along the winding axis of the coil 97. Also, the direction of the magnetic flux that passes through the coil 97 inverts according to the rotation of the power generation rotor 95.

As a result, an induced electromotive force is generated in the coil 97 according to the Lenz's law, and an electric current is generated. An AC voltage is output from the two ends of the coil 97 according to the rotation of the rotating weight 91.

On the other hand, the temperature difference power generator generates power by making use of a temperature difference using a thermoelectric element (Seebeck element). Power is generated by the temperature difference power generator that makes use of a temperature difference between the body temperature of the user and the temperature of the outside air or the case of a wearable apparatus (on a front surface side, for example), in order to obtain the energy source for the wearable apparatus.

Figure 10:
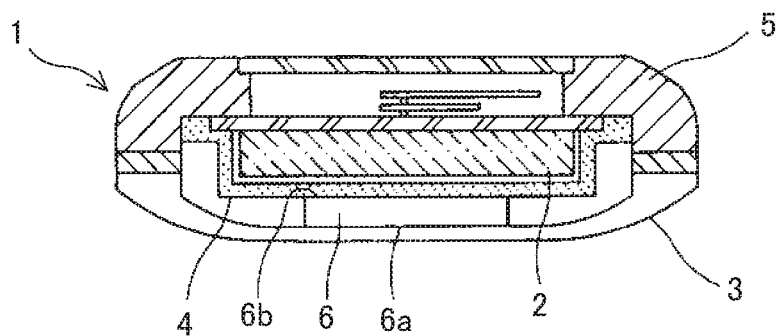
FIG. 10 is a cross-sectional view illustrating an exemplary configuration of a wrist watch device that uses a temperature difference power generator.

FIG. 10 is a cross-sectional view illustrating an exemplary configuration of a wrist watch device that uses the temperature difference power generator. As shown in FIG. 10, a temperature difference power generator 6 is installed between a clocking module 2 that performs clocking and moving of hands of a wrist watch device 1 and a back cover 3. Also, a hot contact 6a of the temperature difference power generator 6 is connected to the back cover 3, and a cold contact 6b is connected to a case 5 via a thermal conductor 4 such as a module cover.

In the temperature difference power generator 6, a plurality of pairs of a P-type semiconductor material and an N-type semiconductor material of a bismuth-tellurium (Bi—Te) base (thermoelectric elements), for example, are interposed between two support substrates that are thermally conductive and constitute the hot contact 6a and the cold contact 6b. These semiconductor materials are connected in series via electrodes so as to generate a predetermined electromotive force. When a temperature difference occurs between the hot contact 6a and the cold contact 6b, a DC voltage is output from two ends of the temperature difference power generator 6.

In the above-described embodiments, a case where the invention is applied to a mobile information processing device has been described, but the invention can also be applied to general charging ICs and power management ICs that are to be applied to rechargeable batteries. The invention is not limited to the embodiments described above, and many modifications can be made within the scope of technical idea of the invention by a person having ordinary skill in the art.

What is claimed is:

1. A mobile information processing device comprising:
a secondary battery for storing electric power;
a power feeding circuit configured to supply electric power to the secondary battery;
a load circuit that includes an electronic circuit that is supplied with electric power from the secondary battery and a sensor that is controlled by the electronic circuit;
a first current detection circuit configured to, when a first enable signal is in an activated state, detect a current flowing between a first node connected to the secondary battery and a second node connected to the power feeding circuit or the load circuit, and generate an output signal, and when the first enable signal is in a deactivated state, stop a current detection operation;
a first voltage detection circuit that is configured to detect a voltage at the first node, and generate an output signal; and
a control circuit that is configured to generate the first enable signal and supply the first enable signal to the first current detection circuit, and is configured to not fetch the output signal of the first voltage detection circuit in a period in which the voltage at the first node fluctuates in association with the first enable signal transitioning from a deactivated state to an activated state.

2. A mobile information processing device comprising:
a secondary battery for storing electric power;
a power feeding circuit configured to supply electric power to the secondary battery;
a load circuit that includes an electronic circuit that is supplied with electric power from the secondary battery and a sensor that is controlled by the electronic circuit;
a first current detection circuit configured to, when a first enable signal is in an activated state, detect a current flowing between a first node connected to one end of the secondary battery and a second node connected to the power feeding circuit or the load circuit, and generate an output signal, and when the first enable signal is in a deactivated state, stop a current detection operation;
a first voltage detection circuit that is configured to detect a voltage at the first node, and generate an output signal; and
a control circuit that is configured to generate the first enable signal and supply the first enable signal to the first current detection circuit, and is configured to start fetching the output signal of the first voltage detection circuit after a first period has elapsed from when the first enable signal transitioned from a deactivated state to an activated state, the first period being a period in which the voltage at the first node fluctuates in association with the first enable signal transitioning from the deactivated state to the activated state.

3. An integrated circuit comprising:
a first current detection circuit that, when a first enable signal is in an activated state, detects a current flowing between a first node and a second node; and when the first enable signal is in a deactivated state, stops a current detection operation;
a first voltage detection circuit that detects a voltage at the first node, and generates an output signal; and
a control circuit that generates the first enable signal and supplies the first enable signal to the first current detection circuit, the control circuit being configured to not fetch the output signal in a period in which the voltage at the first node fluctuates in association with the first enable signal transitioning from a deactivated state to an activated state.

4. The integrated circuit according to claim 3, wherein the control circuit is configured to not fetch the output signal of the first voltage detection circuit in a period in which the first enable signal transitions from an activated state to a deactivated state.

5. The integrated circuit according to claim 3, wherein the control circuit is configured to fetch the output signal of the first voltage detection circuit after a first period has elapsed from when the first enable signal transitioned from a deactivated state to an activated state, and fetch the output signal of the first voltage detection circuit after a second period has elapsed from when the first enable signal transitioned from an activated state to a deactivated state, the first period being longer than the second period.

6. The integrated circuit according to claim 3,
wherein the first voltage detection circuit is configured to, when a second enable signal is in an activated state, detect a voltage at the first node and generate an output signal, and when the second enable signal is in a deactivated state, stop a voltage detection operation, and the control circuit is configured to generate the second enable signal and supply the second enable signal to the first voltage detection circuit, and fetch the output signal of the first current detection circuit in a period other than a period in which the second enable signal transitions from a deactivated state to an activated state.

7. The integrated circuit according to claim 6, wherein the control circuit is configured to fetch the output signal of the first current detection circuit in a period other than a period in which the second enable signal transitions from an activated state to a deactivated state.

8. The integrated circuit according to claim 3, further comprising:

a second current detection circuit configured to, when a third enable signal is in an activated state, detect a current flowing between the first node and the second node, and when the third enable signal is in a deactivated state, stop a current detection operation; and a second voltage detection circuit configured to, when a fourth enable signal is in an activated state, detect a voltage at the first node and generate an output signal, and when the fourth enable signal is in a deactivated state, stop a voltage detection operation, wherein the control circuit is configured to cause the first enable signal and the third enable signal to transition at the same time.

9. The integrated circuit according to claim 3, wherein the first voltage detection circuit operates continuously.

10. A battery pack comprising:

the integrated circuit according to claim 3: and a secondary battery that includes one end connected to the first node.

* * * * *